United States Patent [19]

Pedersen

[11] Patent Number: 5,156,253
[45] Date of Patent: Oct. 20, 1992

[54] SUCTION TABLE, ESPECIALLY FOR AN EXPOSURE STATION

[75] Inventor: Asger Pedersen, Ølstykke, Denmark

[73] Assignee: Eskofot A/S, Ballerup, Denmark

[21] Appl. No.: 673,296

[22] Filed: Mar. 22, 1991

[30] Foreign Application Priority Data

Mar. 22, 1990 [DK] Denmark ............... 0749/90

[51] Int. Cl.⁵ ............................................. B65G 47/00
[52] U.S. Cl. ................................. 198/345.1; 198/456; 198/434
[58] Field of Search ............ 198/456, 345.1, 434, 198/782; 271/236, 251

[56] References Cited

U.S. PATENT DOCUMENTS

| | | | |
|---|---|---|---|
| 2,228,913 | 1/1941 | Martin | 271/251 |
| 3,352,404 | 11/1967 | Settembrini | 198/456 |
| 3,630,518 | 12/1971 | Street | 271/251 |
| 4,111,412 | 9/1978 | Cathers | 271/251 |
| 4,362,298 | 12/1982 | Stefansson et al. | 271/236 |
| 4,426,073 | 1/1984 | Mizuma | 271/251 |
| 4,440,389 | 4/1984 | Ames et al. | 271/251 |
| 4,493,412 | 1/1985 | Krehnovi | 271/236 X |
| 4,575,298 | 3/1986 | Maas et al. | |
| 4,696,465 | 9/1987 | Willi | 271/237 |
| 4,710,088 | 12/1987 | Kramer | |
| 4,792,249 | 12/1988 | Lahr | |
| 4,794,429 | 12/1988 | Acquaviva | 355/76 |

FOREIGN PATENT DOCUMENTS

| | | |
|---|---|---|
| 0043508 | 8/1984 | European Pat. Off. |
| 0235700 | 9/1987 | European Pat. Off. |
| 2427209 | 1/1975 | Fed. Rep. of Germany |
| 2521605 | 12/1975 | Fed. Rep. of Germany |

Primary Examiner—D. Glenn Dayoan
Attorney, Agent, or Firm—Cushman, Darby & Cushman

[57] ABSTRACT

A suction table, especially for an exposure station of an apparatus for producing offset plates, and including an upper suction plate with a plurality of openings, which communicate with a suction means so as to firmly attract an offset plate placed on the suction plate during the exposure. The suction table includes furthermore a conveyor causing an offset plate placed on the suction tabe to move along the upper surface of the suction table, a guide member placed at the upper surface of the suction plate and including a guide surface, which forms an acute angle, preferably an angle of less than 45°, with the moving direction of the conveyor means, and an end stop for the front edge of the plate when seen in the moving direction.

7 Claims, 4 Drawing Sheets

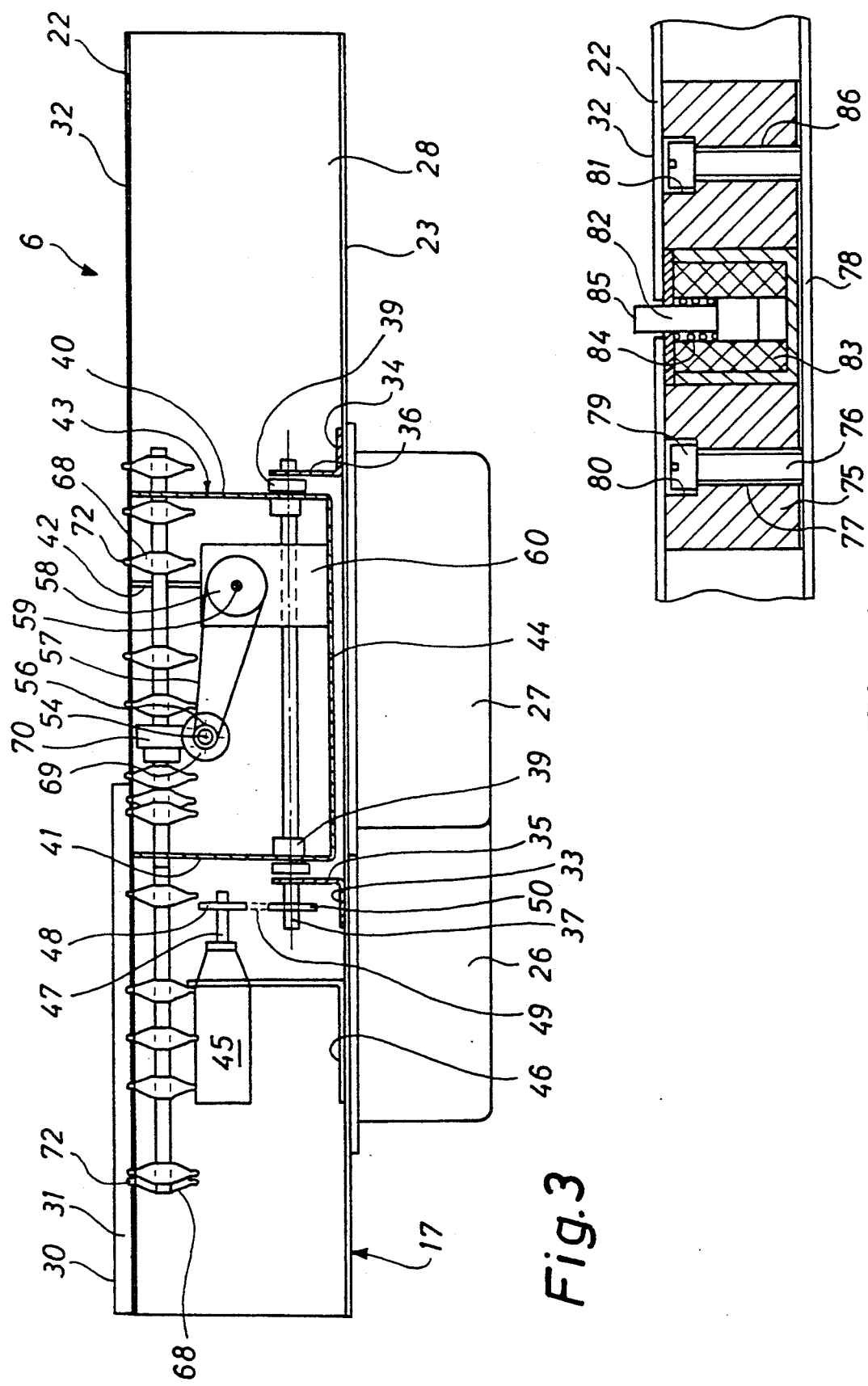

SUCTION TABLE, ESPECIALLY FOR AN EXPOSURE STATION

BACKGROUND OF THE INVENTION

1. Field of the Invention

The invention relates to a suction table, especially for an exposure station of an apparatus for producing offset plates, and comprising an upper suction plate with a plurality of openings, which communicate with a suction means so as to firmly attract an offset plate placed on the suction plate during the exposure.

2. Background Art

Such suction tables serve various purposes within the graphic industry and are inter alia known from U.S. Pat. No. 3,042,356.

It is furthermore known from EP-PS No. 0 043 508 to align and exactly position an offset plate before said plate is placed on a suction table associated with an exposure station.

Finally it is known for instance from U.S. Pat. No. 4,792,249 and EP-PS No. 0 235 700 to retain paper sheets to the conveyor belt of a belt conveyor by applying vacuum to the back of the conveyor belt.

SUMMARY OF THE INVENTION

The object of the invention is to provide a suction table of the above type, which insures an accurate positioning on the suction plate of said suction table of an offset plate advanced thereto or placed thereon.

The suction table according to the invention is characterized in that it comprises a conveyor means causing an offset plate placed on the suction table to move along the upper surface of said suction table, a guide member placed at the upper surface of the suction plate and comprising a guide surface, which forms an acute angle, preferably an angle of less than 45°, with the moving direction of the conveyor means, and an end stop for the front edge of the plate when seen in the moving direction. In this manner the conveyor means will try to advance a plate placed on the suction table in the moving direction, but due to the inclined position of the guide member relative to the moving direction the edge of said plate adjacent the guide member is moved towards the guide surface of said guide member and forced into contact therewith. Accordingly, the plate is accurately positioned when its front edge meets the end stop and the movement of said plate along the guide member is thereby stopped.

According to the invention the angle between the moving direction of the conveyor means and the guide surface of the guide member may be in the range 1° to 45°, whereby very favourable results are achieved in practice.

In addition according to the invention the conveyor means may be a conveyor belt associated with a belt conveyor and comprising air-permeable openings, and the upper conveyor web of which abuts the upper surface of the suction plate.

Furthermore according to the invention the conveyor means may be formed by a plurality of wheels rotatably journalled below the upper surface of the suction plate, said wheels extending through mating openings in the suction plate in such a manner that their periphery is situated above the upper surface of said suction plate. The resulting embodiment turned out to be particularly advantageous in practice, especially when the wheels according to a further embodiment of the invention are mounted in a wheel frame, which relative to the suction plate is displaceable between a position in which the periphery of the wheels is situated above the upper surface of the suction plate, and a position in which the periphery of said wheels is situated below said upper surface. As a result the wheels are lowered into their lower position after they have guided the offset plate into its accurate position determined by the guide member and the stop, whereby the offset plate is completely planely attracted to the upper surface of the suction plate. Accordingly, the resulting exposure of the offset plate is very accurate.

Moreover according to the invention the stop may be displaceably arranged in a slot formed in the suction plate, said slot extending obliquely away from the guide member when seen in the moving direction of the conveyor means. In this manner it is possible to adjust the stop to an almost arbitrary size of plate in such a manner that said stop forms a contact surface for the front edge of the plate between the centre of said plate and the edge of said plate farthest away from the guide member, which is highly advantageous for the accuracy of the positioning. As the slot simultaneously extends obliquely, the stop can be placed such that one central axis of the plate in the adjusted position substantially coincides with the axis of the exposure unit. The latter is of importance for the quality of the obtained exposure and for a simple positioning of originals of various sizes on the original table.

Finally according to the invention the end stop may be a pin displaceable perpendicular to the suction plate by means of an activating means, preferably an electromagnet, so as to be moved between a stop position in which it projects above the upper surface of the suction plate, and a lowered position in which it is placed below the upper surface of the suction plate. The resulting embodiment is particularly advantageous when the suction table is to be used in a plate production apparatus including a developing station, because then the plate can be advanced directly to the developing station by the stop being lowered and by the wheels being elevated.

BRIEF DESCRIPTION OF THE DRAWINGS

The invention is described in greater detail below with reference to the accompanying drawings, in which:

FIG. 3 illustrates the suction table of FIG. 2 in the direction III—III, some parts not being included FIG. 4 is a sectional view taken along the line IV—IV of FIG. 2.

DESCRIPTION OF PREFERRED EMBODIMENTS

Figure 1:
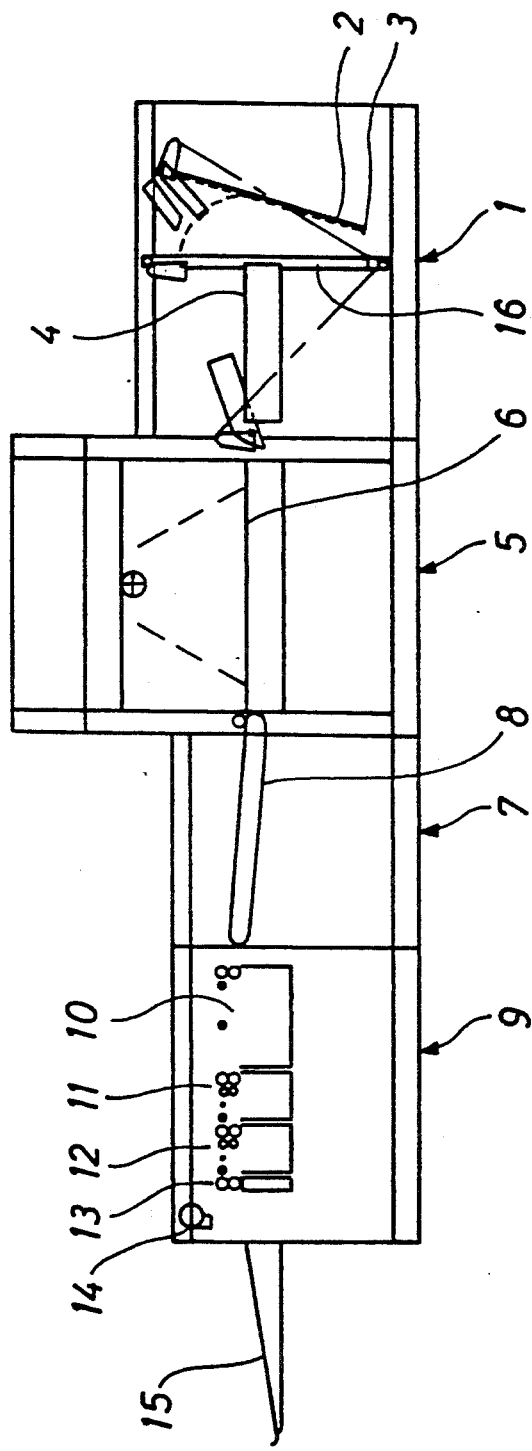
FIG. 1 is a diagrammatic side view of a machine for the production of offset plates and including an exposure station with a suction table according to the invention.

FIG. 1 is a diagrammatic side view of a machine for the production, i.e. exposure and developing, of offset plates and resulting in plates ready for printing use. The machine includes a material unit 1 with a plate magazine 3 obliquely arranged relative to vertical and containing a stack 2 of plates. The machine includes furthermore a roller conveyor 4 and a pivotal arm 16 with a gripping means transferring the uppermost plate in the stack onto the roller conveyor 4. The plate is advanced from the roller conveyor to an exposure station 5, in which the plate is positioned and retained by means of a suction table 6 according to the invention before the exposure. When seen in the moving direction of the plate through the machine, the exposure station is followed by a buffer unit 7 with a belt conveyor 8 and in which the plate is stored until it is advanced to a developing unit 9 with a developing station 10, a washing station 11, a rinsing station 12, a fixing station 13 and a drying station 14. Having passed these stations, the ready-made plate is transferred to a delivery shelf 15.

Figure 2:
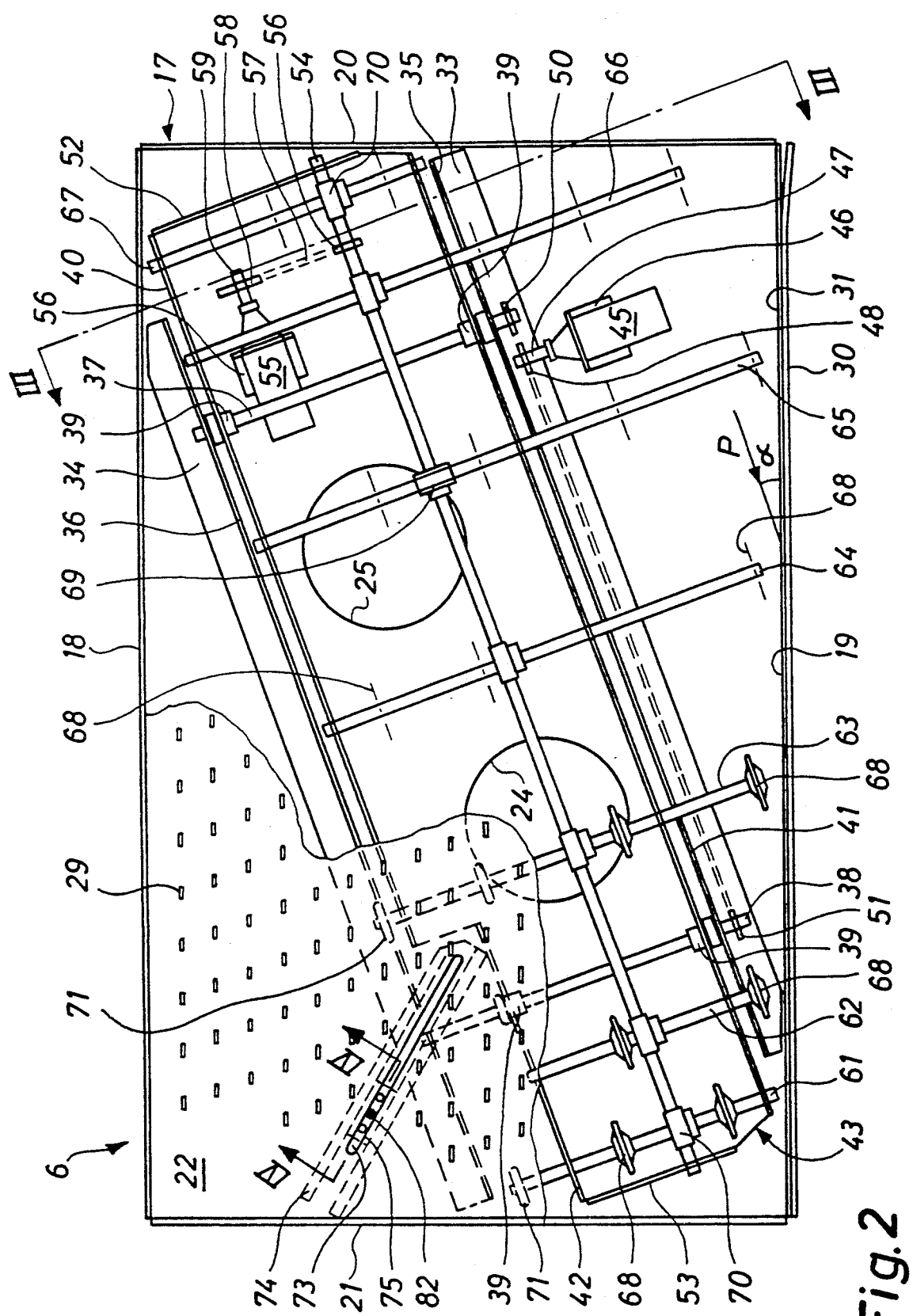
FIG. 2 is a top view of a first embodiment of a suction table according to the invention, some parts not being included.

FIG. 2 is a top view of the suction table 6 of FIG. 1, and FIG. 3 is a view taken along the line III—III of FIG. 2 through said suction table. The suction table 6 comprises a suction box 17 with opposing longitudinal side walls 18, 19 and opposing transverse end walls 20, 21 as well as an upper suction plate 22 and a lower bottom wall 23. The suction plate 22 is provided with a large number of rectangular openings 29. The bottom wall is provided with two circular openings 24, 25 connected to the suction side of a blower 26, 27 so as to provide vacuum in the interior 28 of the suction box 17. A guide member 30 with a guide surface 31 is secured to the longitudinal side wall 19, said guide surface extending beyond the upper surface 32 of the suction plate 22.

Two spaced apart angular members 33, 34 are provided on the bottom wall in the interior 28 of the suction box 17, said members being situated at an angle α of approximately 20° with the guide surface 31 of the guide member 30. Two eccentric shafts 37, 38 are rotatably journalled in the upright legs 35, 36 of the members 33, 34. The eccentric shafts 37, 38 are at the angular members 33, 34 in question provided with an eccentric bushing 39 rotatably journalled in opposing wall portions 40, 41, 42 of a frame 43 of a U-shaped cross section adjacent the bottom 44 thereof. The eccentric positioning of the U-shaped frame 43 renders it possible to elevate and lower said frame relative to the suction box 17 between an elevated position, of FIG. 3, and a lowered position not shown. The elevating and lowering procedure of the U-shaped frame 43 is performed by means of a motor 45 permanently connected to the bottom wall 23 of the suction box 17 by means of a bracket 46, a sprocket wheel 48 being secured to the shaft 47 of said motor. The sprocket wheel 48 can drive sprocket wheels 50, 51 secured to the eccentric shafts 37 and 38, respectively, through a chain 49.

A driving shaft 54 is rotatably journalled in the opposing frame end walls 52, 53 of the frame. The driving shaft can be caused to rotate by means of a chain drive including a sprocket wheel 56 secured to the driving shaft 54, a chain 57 and a driving sprocket wheel 58 secured to the output shaft 59 of a moter 55. The moter 55 is permanently connected to the bottom 44 of the U-shaped frame 43 through a bracket 60.

Seven wheel or roller shafts 61 to 67 with wheels or rollers 68 secured thereon are rotatably journalled in the opposing frame side walls 41, 40, 42 of the frame 43 at a level above the mounting of the driving shaft 54 in the opposing frame end walls 52, 53 of said frame 43. The driving shaft 54 can cause the wheel shafts 61 to 67 to rotate by means of worm wheels 69. The worm wheels 69 are secured to the driving shaft 54 in the areas where said driving shaft according to a top view is intersected by the wheel shafts 61 to 67. The worm wheels 69 engage mating worm wheels 70 secured to the wheel shafts.

FIG. 2 only shows the worm wheel 69 secured on the driving shaft 54 where said shaft intersects the wheel shaft 65, the worm wheel secured on the wheel shaft 65 being deleted. The worm wheels 70 secured to the wheel shafts 61 to 67 are shown at the remaining intersections between the driving shaft 64 and the wheel shafts 61 to 67.

Wheel openings 71 are formed in the suction plate 22 in the areas adjacent the wheels 68 secured to the wheel shafts 61 to 67, some of said wheels only being indicated by dotted lines in FIG. 2. When the U-shaped frame 43 is in the elevated position, the periphery of the wheels 68 is situated above the upper surface 32 of the suction plate 22, as clearly illustrated in FIG. 3. In the elevated position of the frame 43, the plane of rotation of the wheels 68 forms the same angle α of approximately 20° with the guide surface 31 of the guide member 30 as the angular members 33, 34. As a result, the wheels will try to cause a plate placed on the suction table 6 to move in the direction P. When the U-shaped frame 43 is in its lowered position, the periphery 72 of the wheels 68 is situated below the upper surface 32 of the suction plate 22.

The suction plate 22 is provided with a through slot 73 adjacent the end wall 21 of the suction box 17. When seen relative to the direction P, in which the wheels will try to move a plate placed on the suction table 6, the slot 72 extends away from the guide member 30. A guide member 74 of a U-shaped cross section is secured to the bottom side of the suction plate 22 below the slot 73. A slide block 75 is displaceably arranged in the guide member 74, cf. FIG. 4. The slide block 75 is provided with two screws 76 retaining said block relative to the guide member 74. The screws 76 are screwed into threaded holes 77 and extend to the bottom 78 of the U-shaped guide member 74. The heads 79 of the screws 76 are received in countersinkings 80. The slide block 75 is furthermore provided with a lowerable stop in the form of a pin or a core 82. The pin or core 82 is displaceably received in a coil or annular electromagnet 83, and it is spring-loaded by means of a spring 84 towards a lowered position in which its upper end surface 85 is situated below the upper surface 32 of the suction plate 22. A supply of current to the coil 83 causes the core 82 to enter the elevated position of FIG. 4 where its upper end surface 85 is situated at a distance above the upper surface 32 of the suction plate 22.

The suction table 6 operates in the following manner. When an offset plate has been placed on the roller conveyor 4 of FIG. 4, which comprises obliquely arranged wheels corresponding to the wheels of the suction table 6, said plate is moved onto the suction table 6 in such a manner that it is engaged by the wheels 68, the U-shaped frame 43 being elevated into its upper position. Then the wheels 68 will try initially together with the wheels of the roller conveyor 4 and later on alone to move the plate in the direction of the arrow P. As a result, the edge of the plate adjacent the guide member 30 is moved towards said guide member 30 so as to end up being in contact therewith over its entire length. Subsequently, the plate is moved along the guide member 30 and simultaneously forced against said guide member 30 until the front edge of the plate meets the stop pin 82 positioned in its elevated position. Immediately before the front edge of the plate meets the stop in 82, the speed of rotation of the wheels 68 is reduced with the result that the plate softly bumps into the pin 82. When accurately positioned, i.e. when the front edge of the plate abuts the pin 82 and when one side edge of the plate abuts the guide surface 31 of the guide member 30, the U-shaped frame 43 is lowered into its lowered position. As a result, the periphery 72 of the wheels 68 is situated below the upper surface 32 of the suction plate 22. Now the blowers 26, 27 are activated to provide a vacuum in the interior 28 of the suction box 17 with the effect that the plate is attracted firmly to the upper surface of the suction plate 22. Subsequently, the plate is exposed, and when the exposure has been completed the vacuum blowers 26, 27 are deactivated the stop pin 82 is lowered. Then the U-shaped frame 43 and consequently the wheels 68 are elevated and the wheel motor 55 is started with the result that the plate is removed from the suction table 6 and transferred to the belt conveyor 8 of the buffer unit 7. When the rear edge of the plate has left the suction table 22, another plate can be advanced and placed thereon, the stop pin 82 being elevated simultaneously therewith.

Figure 5:
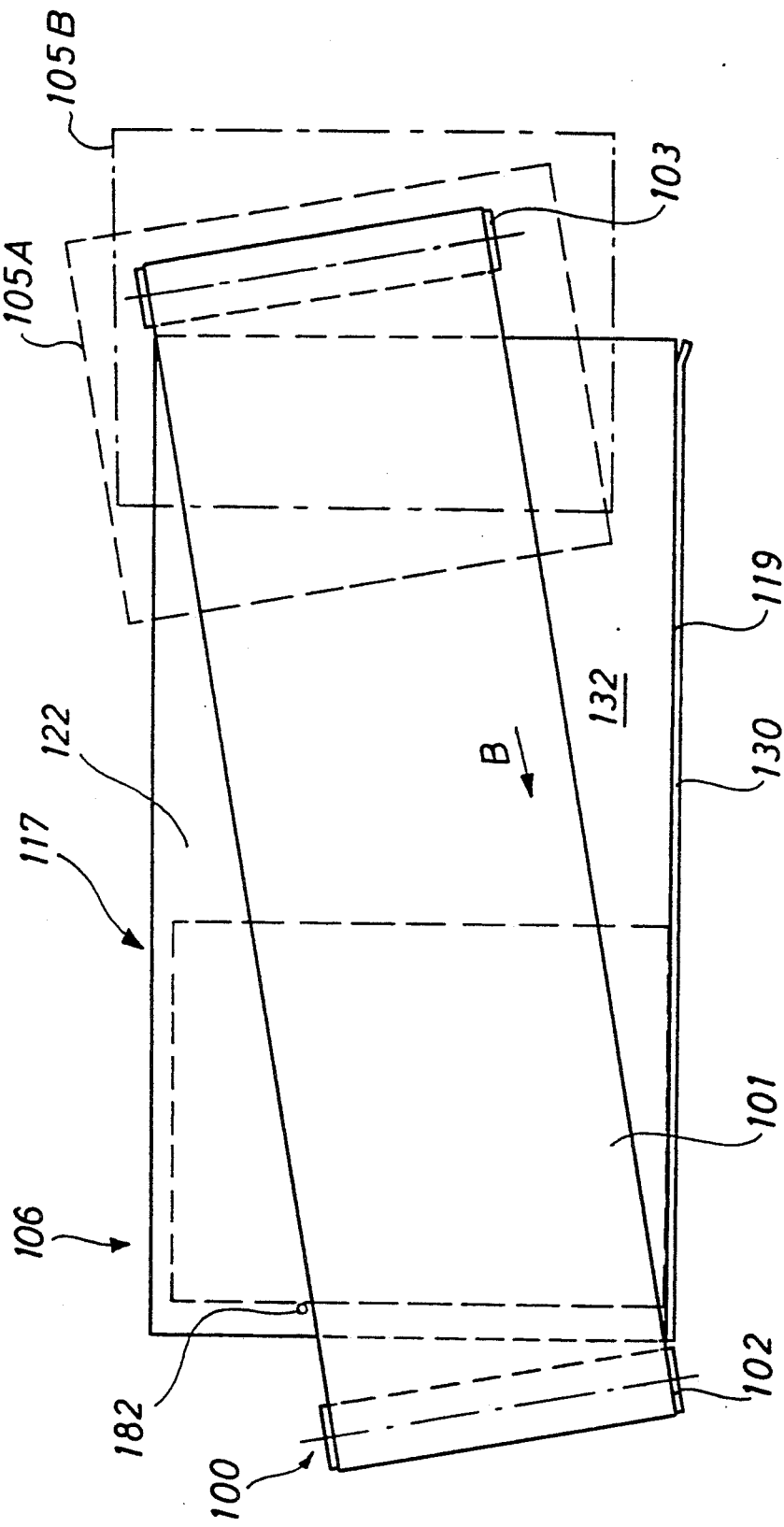
FIG. 5 is a diagrammatic top view of a second embodiment of a suction table according to the invention.

FIG. 5 is a diagrammatic top view of an alternative embodiment of a suction table 106 according to the invention. The suction table 106 comprises a suction box 117 with an upper suction plate 122 provided with a large number of small openings not shown. The suction table 106 comprises furthermore a guide member 130 secured to one longitudinal side wall 119 of the suction box 117 in such a manner that it extends above the upper surface 132 of the suction plate 122. A belt conveyor 100 comprises a conveyor belt 101 with air-permable openings and two conveyor rollers 102, 103, said belt conveyor 100 being arranged such relative to the suction box 117 that the upper conveyor web of the conveyor belt 101 abuts the upper surface 132 of the upper suction plate 122. The belt conveyor 100 is furthermore arranged such that the upper conveyor web thereof extends obliquely inwards towards the guide member 130 when seen in the moving direction B of said belt conveyor.

A plate placed on the conveyor belt, for instance as indicated by the reference numeral 105a or 105b, is advanced by the conveyor belt 101 towards the guide member 130. During the advancing movement, the edge of the plate adjacent the guide member 130 abuts at a time said guide member 130 completely, and while abutting said guide member the plate is advanced further until its front edge meets a stop pin 182. In this manner the plate is accurately positioned by its abutment against both the stop pin 182 and the guide member 130. Subsequently, the conveyor belt 101 is stopped and vacuum is applied to the suction box 117 so as to firmly attract the plate to the upper surface 122 thereof.

The invention may be modified in many ways without thereby deviating from the scope thereof. Thus more and stops 82 may be provided which can be adjusted in advance for use for different sizes of plate. In this manner it is possible to alter the size of the plate without necessitating a repositioning of the end stops because said end stops can be adjusted in advance to the sizes to be produced on the machine.

In addition, the end stop 82 may be connected to an adjustment means, such as a motor, for the adjustment of the position of said end stop. As a result it is possible to adjust the position of the end stop very quickly, which is of importance in connection with frequent alterations between a large number of various sizes of plates.

I claim:

1. A suction table, especially for an exposure station of an apparatus for producing offset plates, and comprising an upper suction plate with a plurality of openings, which communicate with a suction means so as to firmly attract an offset plate placed on the suction plate during the exposure, wherein it comprises a conveyor means (68, 101) causing an offset plate placed on the suction table to move along the upper surface (32, 132) of said suction table, a guide member (30, 130) placed at the upper surface of the suction plate and comprising a guide surface (31, 131), which forms an acute angle, preferably an angle of less than 45°, with the moving direction (P, B) of the conveyor means (68, 101), and an end stop (82, 182) for the front edge of the plate when seen in the moving direction.

2. Suction table as in claim 1, wherein the angle between the moving direction (P, B) of the conveyor means (68, 101) and the guide surface (31, 131) of the guide member (30, 130) is in the range 1° to 45°.

3. Suction table as in claim 1, wherein the conveyor means is a conveyor belt (101) associated with a belt conveyor (100) and comprising air-permeable openings, and the upper conveyor web of which abuts the upper surface of the suction plate (122).

4. Suction table as in claim 1, wherein the conveyor means is formed by a plurality of wheels (68) rotatably journalled below the upper surface (32) of the suction plate (22), said wheels extending through mating openings (71) in the suction plate (22) in such a manner that their periphery (72) is situated above the upper surface (32) of said suction plate.

5. Suction table as in claim 4, wherein the wheels (72) are mounted in a wheel frame (43), which relative to the suction plate (22) is displaceable between a position in which the periphery (72) of the wheels (68) is situated above the upper surface (32) of the suction plate (22), and a position in which the periphery (72) of said wheels (68) is situated below said upper surface (32).

6. Suction table as in claim 1, wherein the stop (82) is displaceably arranged in a slot (73) formed in the suction plate, said slot extending obliquely away from the guide member (30) when seen in the moving direction (P) of the conveyor means (68).

7. Suction table as in claim 1 or 6, further comprising the end stop (82) is a pin displaceable perpendicular to the suction plate (22) by means of an electromagnet (83), so as to be moved between a stop position in which it projects above the upper surface (32) of the suction plate (22), and a lowered position in which it is placed below the upper surface (32) of the suction plate (22).

* * * * *